(12) United States Patent  (10) Patent No.: US 7,733,102 B2
Cheng  (45) Date of Patent: Jun. 8, 2010

(54) ULTRA-FINE AREA ARRAY PITCH PROBE CARD

(75) Inventor: Hsu Ming Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 41 days.

(21) Appl. No.: 11/775,732

(22) Filed: Jul. 10, 2007

(65) Prior Publication Data

US 2009/0015275 A1  Jan. 15, 2009

(51) Int. Cl.
*G01R 31/02* (2006.01)

(52) U.S. Cl. .................. 324/754; 324/761; 324/762

(58) Field of Classification Search .................. None
See application file for complete search history.

(56) References Cited

U.S. PATENT DOCUMENTS

| | | | |
|---|---|---|---|
| 5,177,439 A | 1/1993 | Liu et al. | |
| 5,476,211 A | 12/1995 | Khandros | |
| 5,974,662 A | 11/1999 | Eldridge et al. | |
| 6,238,938 B1 | 5/2001 | Smith | |
| 6,292,003 B1 * | 9/2001 | Fredrickson et al. | 324/754 |
| 6,586,955 B2 | 7/2003 | Fjelstad et al. | |
| 6,661,244 B2 | 12/2003 | McQuade et al. | |
| 6,676,438 B2 | 1/2004 | Zhou et al. | |
| 6,815,961 B2 * | 11/2004 | Mok et al. | 324/754 |
| 6,906,540 B2 | 6/2005 | McQuade et al. | |
| 6,917,102 B2 * | 7/2005 | Zhou et al. | 257/698 |
| 7,049,837 B2 | 5/2006 | Kasukabe et al. | |
| 7,071,715 B2 | 7/2006 | Shinde et al. | |
| 7,129,730 B2 | 10/2006 | Liu et al. | |
| 7,145,354 B2 | 12/2006 | Stillman | |
| 2003/0057976 A1 * | 3/2003 | Deguchi | 324/754 |
| 2006/0033515 A1 | 2/2006 | Haba | |
| 2006/0125498 A1 | 6/2006 | Liu et al. | |
| 2007/0152689 A1 | 7/2007 | Lee et al. | |
| 2007/0222465 A1 | 9/2007 | Huang et al. | |
| 2008/0048685 A1 * | 2/2008 | Chui et al. | 324/754 |
| 2008/0116923 A1 | 5/2008 | Cheng et al. | |
| 2008/0180123 A1 | 7/2008 | Cheng et al. | |

\* cited by examiner

*Primary Examiner*—Minh N Tang
(74) *Attorney, Agent, or Firm*—Slater & Matsil, L.L.P.

(57) ABSTRACT

A system and a method of testing a semiconductor die is provided. An embodiment includes a printed circuit board connected to a space transformation layer, which is connected to a substrate. The substrate uses through silicon vias and a redistribution layer to reduce the pitch of the connections beyond the historical limitations. A probe head using Cobra-style probe pins is connected to the redistribution layer through C4 bumps.

20 Claims, 7 Drawing Sheets

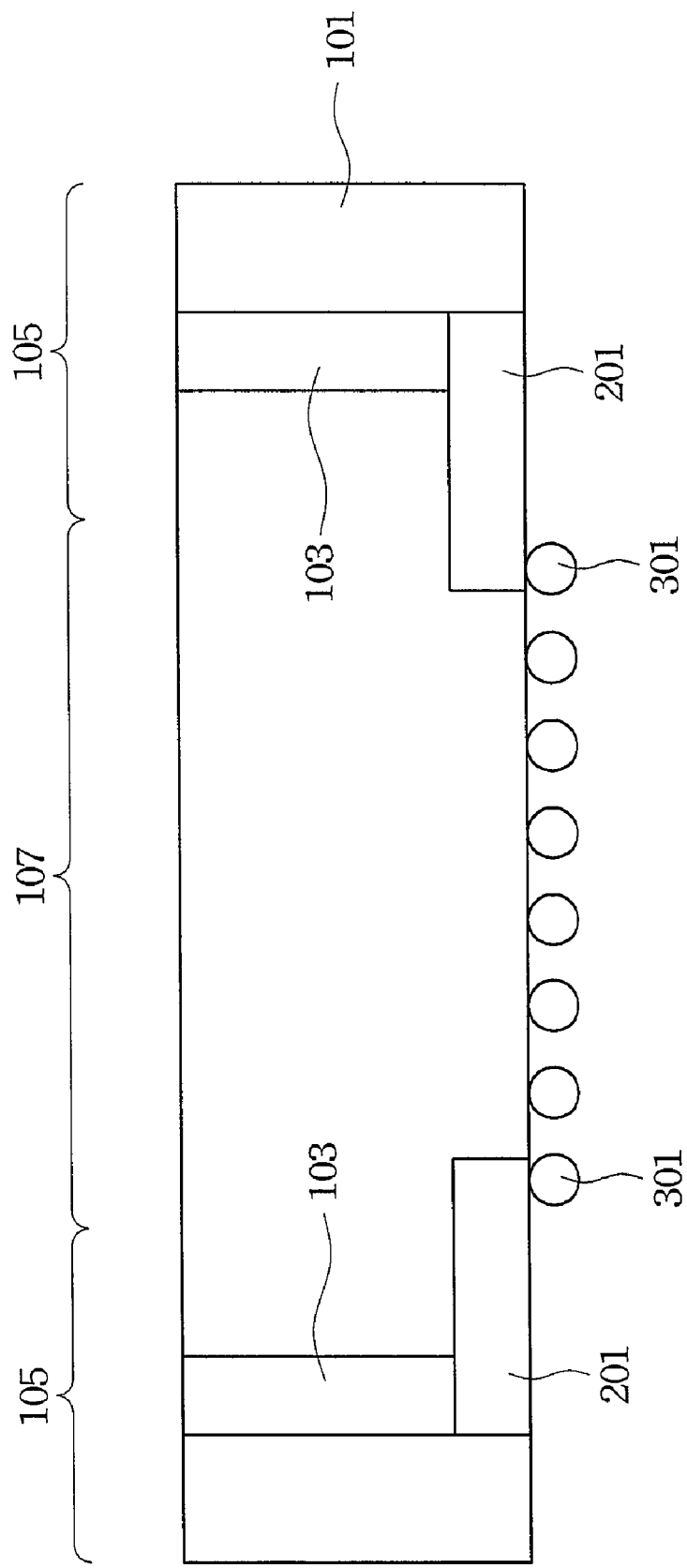

ULTRA-FINE AREA ARRAY PITCH PROBE CARD

TECHNICAL FIELD

The present invention relates generally to a system for testing semiconductor devices and, more particularly, to a system and method for forming a probe card with an ultra-fine pitch.

BACKGROUND

In the manufacturing of integrated circuits and other semiconductor devices, the circuits and devices must be tested in order to ensure that a functional device has been manufactured. These tests are usually performed by contacting a test probe card to the relevant areas of the semiconductor device, sending current to the semiconductor device and performing one or more functional tests. Two main types of probe cards are currently used to make these connections.

The first main type of probe card uses a series of cantilever connectors that radiate inward from the edges of the probe card. When the probe card is lowered onto the semiconductor device to be tested, the cantilevered connectors connect to corresponding contact pads on the semiconductor device to complete the electrical connections for the test. Unfortunately, this type of probe card is limited due to the fact that the contact pads are limited to the peripheral of the semiconductor device to be tested, and cannot reach contact pads located in the central areas of the devices.

The second type of probe card uses an array of electrical connections in order to connect to a semiconductor device in other areas than the periphery. In this type of probe card, the electrical connections are spaced closely together in an array and are shaped so that the electrical connections absorb some of the shock of the impact when the probe card is lowered onto the semiconductor device to be tested. However, the minimum pitch (the distance between the electrical connections) for this type of card has historically been limited by the structure and shape of the electrical connections between the printed circuit board and the tips of the probe pins. Historically, the finest pitch attainable with this type of probe card is about 175 µm.

Unfortunately, as the dimensions of semiconductor devices are reduced in the ever-present drive for smaller and smaller devices, the pitches of these types of probe cards will be unable to adequately test semiconductor devices requiring a smaller probe pitch. Accordingly, a probe card with a smaller probe pitch is needed.

SUMMARY OF THE INVENTION

These and other problems are generally solved or circumvented, and technical advantages are generally achieved, by embodiments of the present invention that include a semiconductor device test structure. An advantage of embodiments of the present invention is that a smaller contact pitch can be obtained. This allows for the testing of smaller structures.

In accordance with an embodiment of the present invention, a device for testing semiconductor devices comprises a printed circuit board electrically connected to a space transformation layer through first connectors that have a first pitch. Through vias are located in a substrate, and the vias are electrically connected to the space transformation layer through second connectors. On the opposite side of the substrate from the space transformation layer, redistribution lines electrically connect the vias to third connectors that have a smaller pitch than the vias.

In accordance with another embodiment of the present invention, a device for testing semiconductor devices comprises an array of probe pins that has a first pitch. First connectors located on a substrate are in electrical contact with the probe pins, and redistribution lines are used to fan the pitch out to vias located through the substrate. The vias are electrically connected to a space transformation layer that fans the pitch out even further. The space transformation layer is also connected to a printed circuit board.

In accordance with yet another embodiment of the present invention, a device for testing semiconductor devices comprises a substrate with vias located along an outer portion of the substrate. Redistribution lines connect the vias to respective ones of first connectors located on an inner portion of the substrate. The first connectors also have a smaller pitch than the vias. Probe pins are in electrical connection with the first connectors. On an opposite side of the substrate from the first connectors, the vias are connected to a space transformation layer. The space transformation layer is connected to a printed circuit board through third connectors that have a larger pitch than the vias.

An advantage of a preferred embodiment of the present invention is that the pitch of the probe pins can be reduced in devices that incorporate the present invention. This invention allows these devices to test smaller devices than similar devices that do not incorporate this invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A and FIG. 3B illustrate a cross-sectional view and a top-down view, respectively, of the structure of FIG. 2 after the formation of C4 bump connectors in accordance with an embodiment of the present invention;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a probe card. The invention may also be applied, however, to other non-permanent electrical connections.

Figure 1:
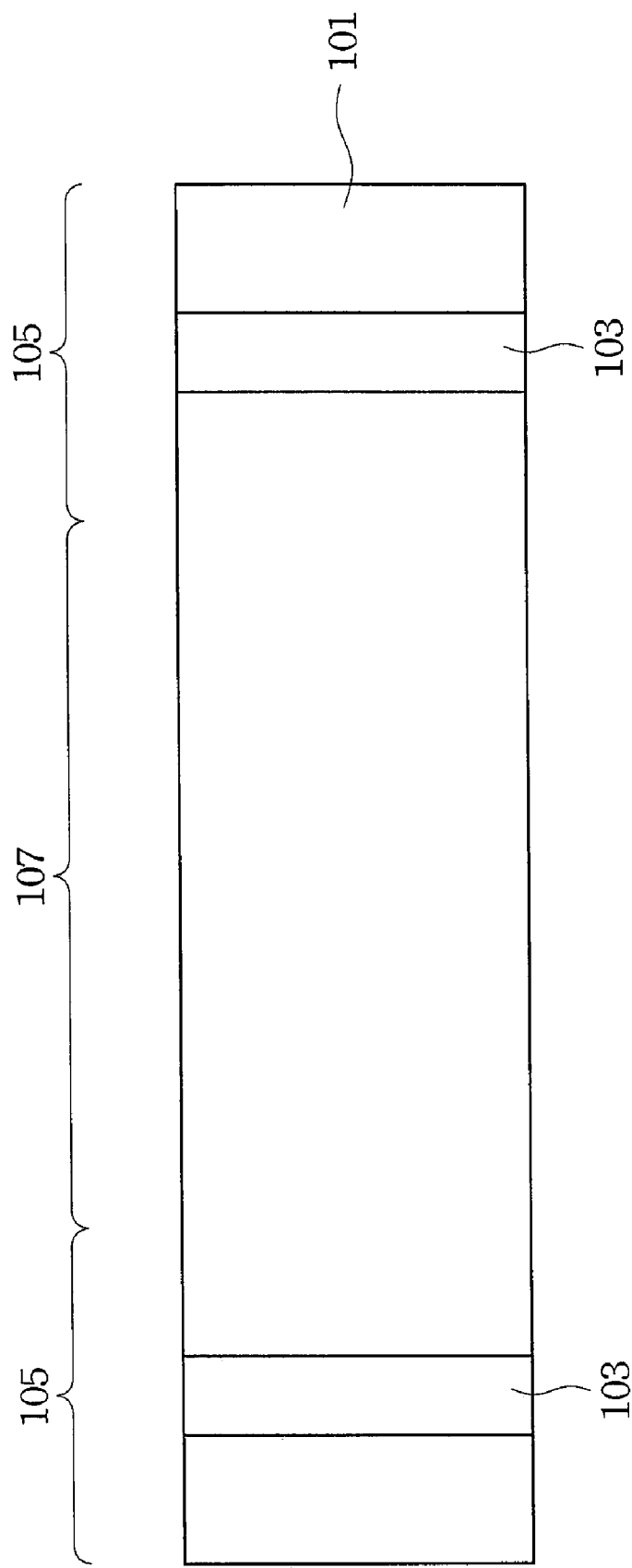
FIG. 1 illustrates a cross-sectional view of a structure with vias formed within a substrate in accordance with an embodiment of the present invention.

With reference now to FIG. 1, there is shown a silicon substrate 101 with vias 103 formed therein. The substrate 101 comprises a semiconductor material such as silicon, germanium, silicon germanium, or combinations thereof. The substrate 101 is initially between about 150 μm to about 762 μm, with a preferred thickness of about 500 μm.

The vias 103 preferably extend through the substrate 101, and are preferably located along an outer portion 105 of the substrate 101, leaving an inner portion 107 of the substrate 101 void of vias 103. The vias 103 preferably have a pitch of between about 100 μm and about 1,000 μm, with a preferred pitch of about 200 μm.

The vias 103 may be formed by any appropriate method. For example, in an embodiment openings are formed partially through the substrate 101. The openings may be formed, for example, by one or more etching processes, milling, laser techniques, or the like. The openings are lined with diffusion barrier layers, adhesion layers, isolation layer, or the like, and filled with a conductive material. Preferably, diffusion barrier layers (not shown), comprise one or more layers of TaN, Ta, TiN, Ti, CoW, or the like, and the conductive material comprises copper, tungsten, aluminum, silver, and combinations thereof, or the like, thereby forming the vias 103. In an embodiment, the vias 103 have a diffusion barrier layer of TaN and are filled with copper formed by an electro-chemical plating process in which a seed layer is deposited to aid in the formation of the conductive fill material.

In another embodiment, the vias 103 are formed and filled with a dielectric material. After grinding the backside of the die, the dielectric material is removed via an etching process and replaced with a conductive material, such as copper. Other methods and materials may be used.

Figure 2:
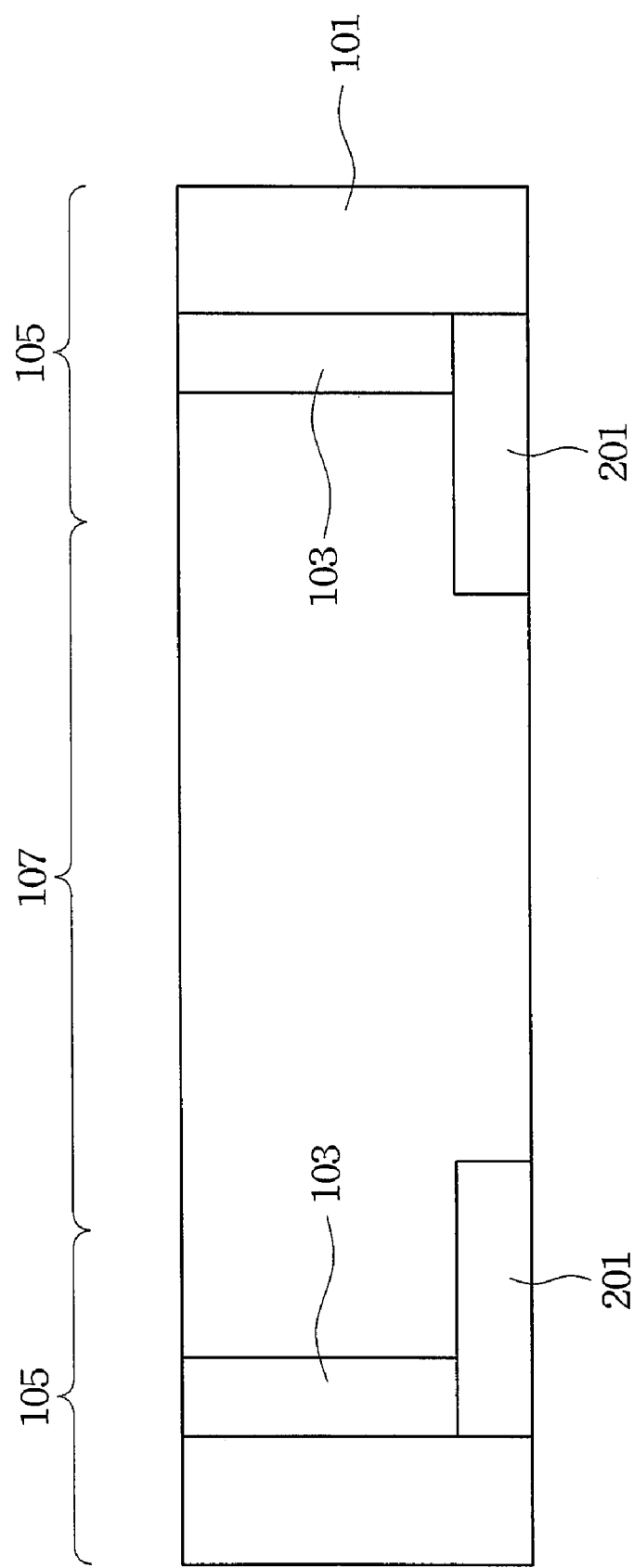
FIG. 2 illustrates a cross-sectional view of the structure of FIG. 1 after the forming of a redistribution line in accordance with an embodiment of the present invention.

FIG. 2 illustrates the formation of redistribution lines 201 on one side of the substrate 101 and in electrical connection with the vias 103. The redistribution lines 201 preferably extend from their respective vias 103 located in the outer portion 105 of the substrate 101 and extend into the inner portion 107 of the substrate 101. The redistribution lines 201 are preferably used to reduce the pitch of the vias 103 as the redistribution lines 201 extend from the outer portion 105 of the substrate 101 to the inner portion 107 of the substrate 101.

The redistribution lines 201 may be formed using common methods for forming interconnect lines in integrated circuits. Preferably, the redistribution lines 201 comprise at least one conductive layer formed of a metal such as aluminum, copper, tungsten, titanium, and combinations thereof. The redistribution lines 201 are preferably formed by plating the metal on a seed layer and then etching the undesired portions, leaving the redistribution lines 201. The redistribution lines 201 should be between about 2 μm and about 30 μm, with a preferred width of about 5 μm. However, other materials and process, such as a well-known damascene process, could alternatively be used to form the redistribution lines 201.

As one of skill in the art will recognize, the redistribution lines 201 could be a single layer of conductive material or else could alternatively be multiple layers of conductive material, depending upon the properties desired. For example, the redistribution lines 201 as formed above may be plated with another conductive material such as gold or chromium to provide good adhesion for a subsequently formed connector (described below with respect to FIG. 3A). This plating could be done through a process such as CVD.

FIG. 3A illustrates the formation of first connectors 301 in contact with respective ones of the redistribution lines 201. In a preferred embodiment, the first connectors 301 are controlled, collapse chip connection (C4) bumps. The first connectors 301 are formed to have a pitch between about 30 μm and about 150 μm, with a preferred pitch of less than about 130 μm, and an even more preferred pitch of about 50 μm. The first connectors 301 are preferably formed of a hard conductive material such as a nickel-cobalt alloy, although other conductive materials, such as tin, copper, or silver could alternatively be used.

The first connectors 301 may be formed by initially forming a layer of conductive material (or multiple layers of conductive material) through such commonly used methods such as evaporation, electroplating, printing, solder transfer, ball placement, etc, to a thickness of between about 5 μm and about 50 μm, with a preferred thickness of about 25 μm. Once the layer of the conductive material has been formed, a reflow is preferably performed in order to shape the material into the desired bump shape.

Optionally, the conductive material of the first connectors 301 may be plated with another conductive material in order to form desired adhesive or barrier characteristics. In an embodiment in which a nickel-cobalt alloy is used to form the first connectors 301, the nickel-cobalt alloy may be plated with gold, although other materials, such as silver, rhodium, or tungsten, could alternatively be used.

Figure 3B:
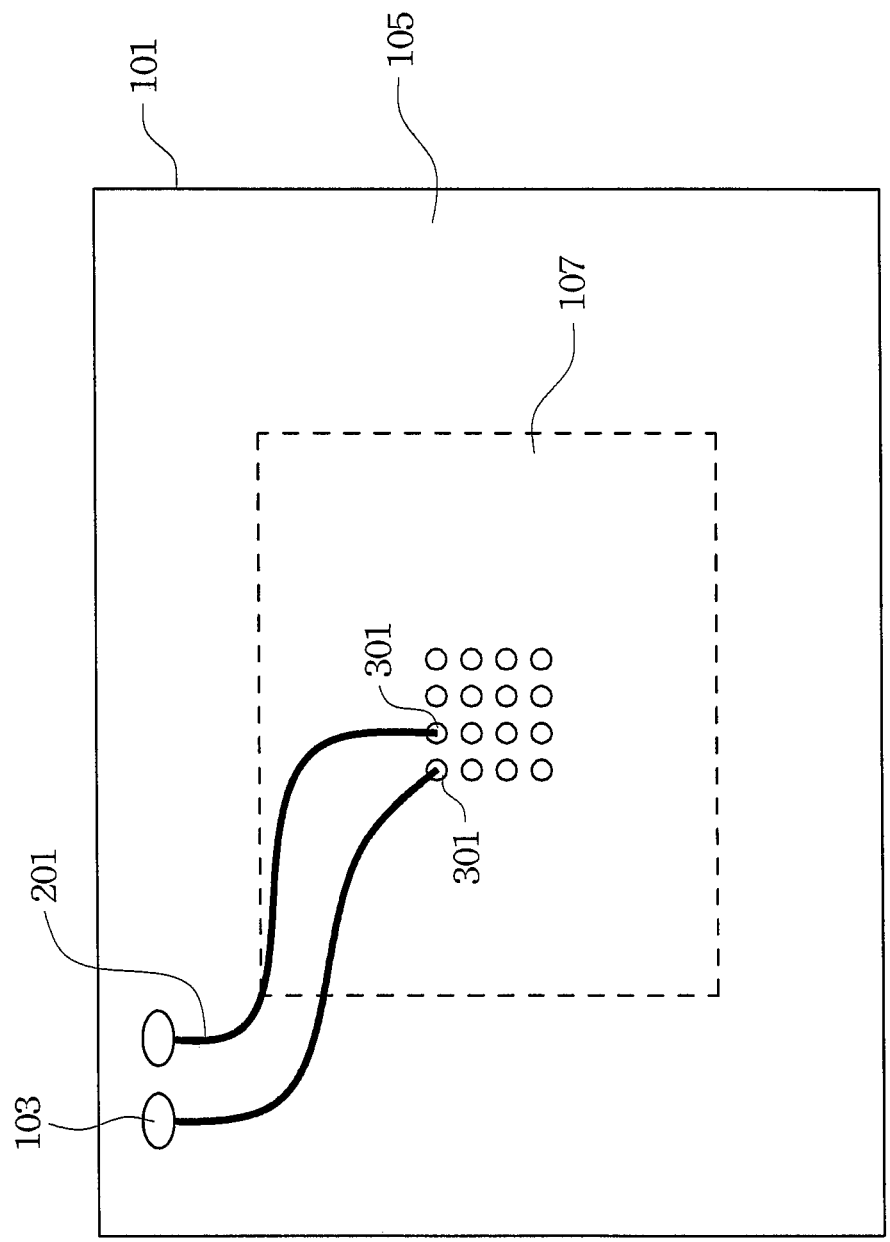

FIG. 3B illustrates a top-down view of a side of the substrate 101 and the first connectors 301. This figure illustrates two redistribution lines 201 between the vias 103 and the first connectors 301. As described above with reference to FIGS. 1-3A, the vias 103 are located along the outer potion 105 of the substrate 101 and the first connectors 301 are located within the inner portion 107 of the substrate 101. Further, the vias 103 have a much larger pitch than the first connectors 301. Finally, the redistribution line 201 connects the vias 103 with respective ones of the first connectors 301.

Figure 4:
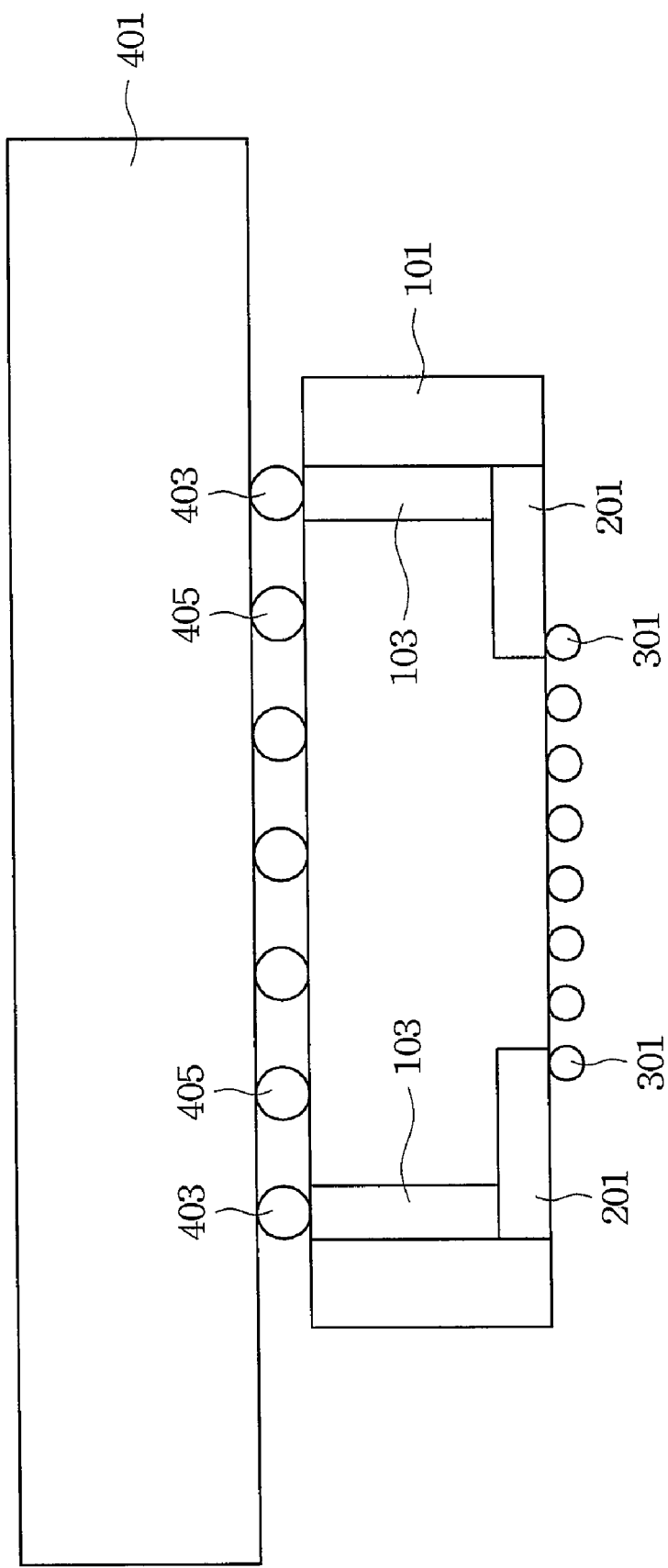
FIG. 4 illustrates a cross-sectional view of the structure of FIG. 3 after it has been connected to a space transformation layer with solder bumps in accordance with an embodiment of the present invention.

FIG. 4 illustrates the connection of the vias 103 to a space transformation layer 401 through solder bumps 403, although other types of connectors could alternatively be used. Solder bumps 403 are formed on the space transformation layer 401 and are placed so as to align with vias 103 located in the substrate 101. The solder bumps 403 preferably comprises either a high-lead, eutectic, or lead-free solder. When the vias 103 are placed upon this solder bump 403, electrical contact is established between the first connectors 301 and conductors (not shown) located within the space transformation layer 401.

The space transformation layer 401 is preferably formed of a multiple layer ceramic, although a multiple layer organic could alternatively be used. The space transformation layer 401 preferably comprises alternating layers of conductive and insulative materials (not shown). The routing of the conductive material through the space transformation layer 401 is designed to accept the pitch of the solder bumps 403 and their corresponding vias 103 and expand the pitch to another set of contact pads on an opposite side of the space transformation layer 401.

Optionally, a number of dummy bumps 405 that are not electrically connected to corresponding vias 103 may also be formed between the space transformation layer 401 and the substrate 101. In an embodiment in which the vias 103 are formed along the outer portion 105 of the substrate 101, the solder bumps 403 that are electrically connected to the vias 103 would be positioned only along the outer portion of the substrate, causing unequal stresses to build between the inner portion 107 of the substrate 101 and the outer portion 105 of the substrate 101 when a device is being tested. To balance these stresses during probing, dummy bumps 405, preferably solder bumps that are not electrically connected to the vias 103, are formed in the inner portion 107 of the substrate 101, where there are no vias 103. These dummy bumps 403 may be formed in a similar fashion as the solder bumps described above with reference to FIG. 4.

Figure 5:
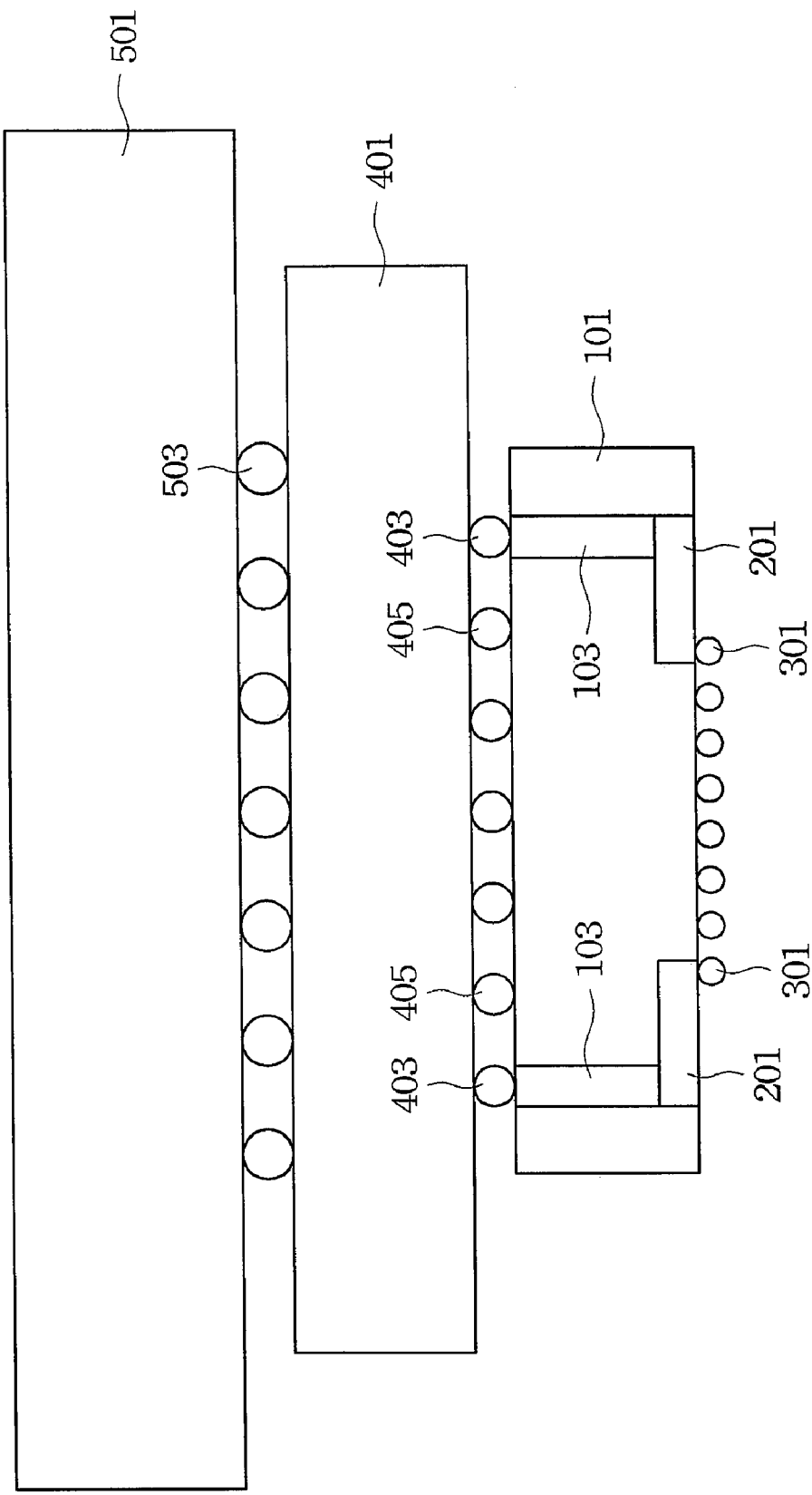
FIG. 5 illustrates a cross-sectional view of the structure of FIG. 4 after it has been connected to a printed circuit board with solder balls in accordance with an embodiment of the present invention.

FIG. 5 illustrates the connection of the space transformation layer 401 to a printed circuit board (PCB) 501 through solder balls 503. The solder balls 503 are preferably formed of high-lead, eutectic, or lead-free solder, and are formed so as to create an electrical connection between the space transformation layer 401 and the PCB 501. The solder balls 503 have a pitch between about 300 μm and about 1,400 μm, with a preferred pitch of about 1,000 μm, which is a larger pitch than the vias 103 and their associated solder bumps 403.

Figure 6:
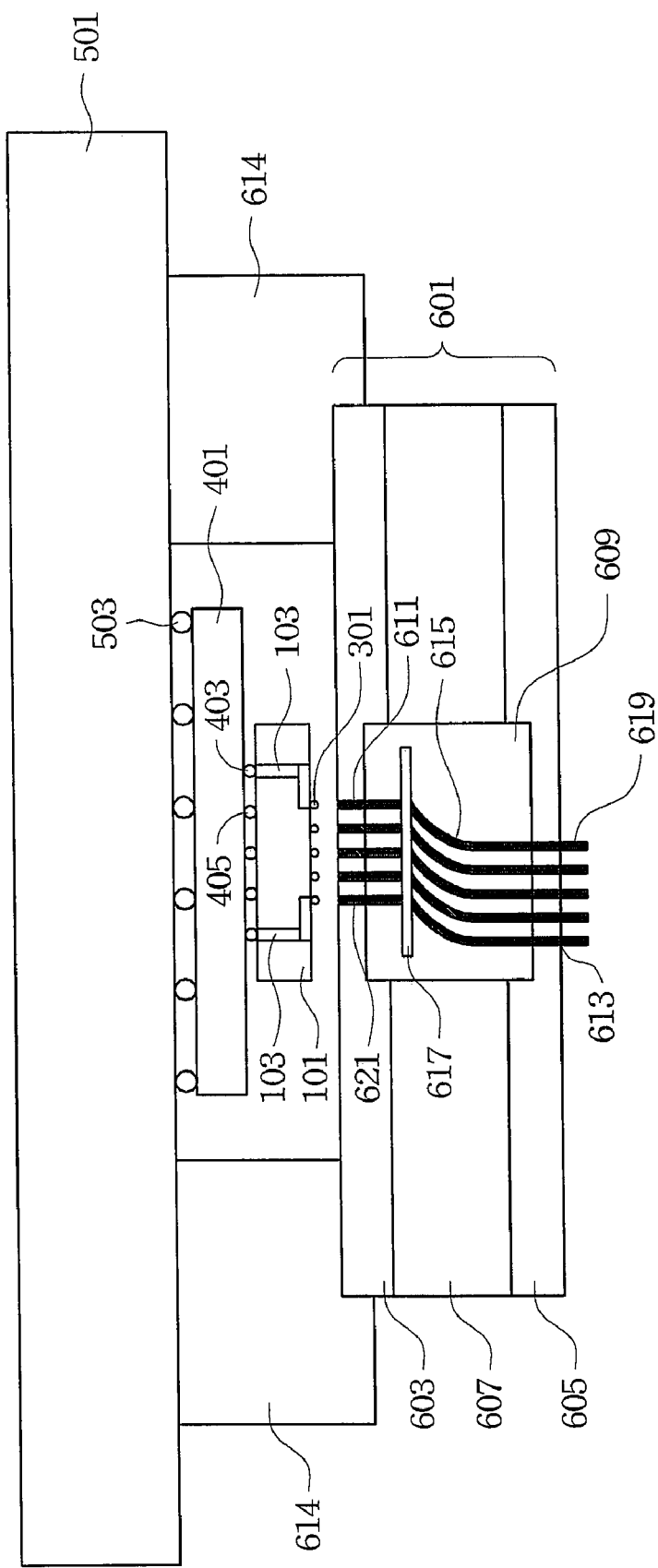
FIG. 6 illustrates a cross-sectional view of the structure of FIG. 5 after the C4 bumps have been connected to a probe head in accordance with an embodiment of the present invention.

FIG. 6 illustrates the connection of the C4 bumps 301 to probe pins 615 located within a probe head 601. In an embodiment, the probe pins 615 are each a continuous piece of metal that has a pin head 621 for electrical connection to the C4 bumps 301 and a pin tip 619 for electrical connection to the device to be tested. Preferably, the probe pins 615 extend through the probe head 601, with the pin heads 621 extending away from the probe head 601 towards the C4 bumps 301 and the pin tips 619 extending away from the probe head 601 towards the device to be tested.

In an embodiment, the probe head 601 is a Cobra-type probe head. In this embodiment the probe head 601 has a first die 603, a second die 605, a spacer 607 separating the first die 603 and second die 605, and an aperture 609 located across the spacer 607 and extending into the first die 603 and the second die 605. The first die 603 and second die 605 are typically made from an insulating material such as vespel or ceramic.

The first die 603 preferably has a first array of holes 611 that extend through the first die 603 and connect to the aperture 609. The first array of holes 611 preferably have substantially the same pitch as the C4 bumps 301 located on the substrate 101. Upon alignment of the probe head 601, the first array of holes 611 will preferably be substantially aligned with the C4 bumps 301 so that probe pins 615 located within the first array of holes 611 (described more fully below) will come into contact with the C4 bumps 301 during testing of a device.

On the opposite side of the aperture 609, the second die 605 has a second array of holes 613, with a substantially similar pitch as the first array of holes 611. However, the second array of holes 613 is preferably offset from the first array of holes 611 by between about 500 μm and about 1,400 μm, with a preferred offset of about 1,170 μm. The intentional offset of the first array of holes 611 and the second array of holes 615 promote a buckling of the probe pins 615 to relieve pressure during testing.

The probe pins 615 are located so that they extend through the first array of holes 611, the aperture 609, and the second array of holes 613. A mounting film 617 located within the aperture 609 and formed from a suitable polymeric dielectric, such as mylar, is typically used to hold the probe pins 615 in place. The probe pins 615 extend away from the second array of holes 613 to terminate in probe pin tips 619, which are used to make electrical contact with a device to be tested. The probe pins 615 also extend away from the first array of holes 611 so as to come into contact with the C4 bumps 301 during testing of a device to provide the electrical contact between the device to be tested and the printed circuit board 501. The probe pins 615 are designed to slide within the first array of holes 611 during testing in order to absorb some of the pressure during testing of a device.

The probe head 601 is aligned to the C4 bumps 301 through a mounting ring 614. The mounting ring 614 is located on the PCB 501, and the probe head 601 fits within the mounting ring 614 such that the C4 bumps 301 are aligned with the probe pins 615 so that, during testing, the probe pins 615 and the C4 bumps 301 come into electrical contact with each other. The mounting ring 614 prevents the probe head 601 from moving side to side and coming out of alignment.

As described in the preceding paragraphs, the present invention reduces the pitch of the C4 bumps 301 that form the connection between the PCB 501 and the probe pins 615. By relieving this bottleneck, the overall pitch of the probe pins 615 can be reduced, thereby allowing probe cards utilizing this invention to be used to test smaller and smaller devices.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device test structure comprising:
a printed circuit board;
a space transformation layer comprising conductive lines, the conductive lines electrically connected to the printed circuit board by first connectors with a first pitch;
a substrate having vias extending through the substrate from a first side of the substrate to a second side of the substrate, the vias having a uniform width and being electrically connected to the conductive lines through second connectors, the second connectors having a second pitch smaller than the first pitch, the substrate located opposite the printed circuit board;
redistribution lines physically connected to respective ones of the vias, the redistribution lines located on the substrate opposite the space transformation layer; and
third connectors electrically connected to respective ones of the redistribution lines, the third connectors having a third pitch that is smaller than the second pitch.

2. The device of claim 1, further comprising a probe head with probe pins located therein, the probe pins in contact with the third connectors.

3. The device of claim 2, wherein the probe head comprises:
- a first die with a first array of holes located therein, the first array of holes having a fourth pitch and aligned with the third connectors;
- a second die with a second array of holes having a fifth pitch that is substantially similar to the fourth pitch, the second array of holes offset from the first array of holes; and
- a spacer located between the first die and the second die;
- wherein the probe pins extend from the first array of holes to the second array of holes.

4. The device of claim 1, wherein the vias are located along an outer portion of the substrate and the third connectors are located along an inner portion of the substrate.

5. The device of claim 1, further comprising dummy connectors located between the substrate and the space transformation layer in an area of the substrate that does not contain vias.

6. The device of claim 1, wherein the redistribution lines comprise two or more conductive layers.

7. The device of claim 1, wherein the third pitch is less than about 130 μm.

8. The device of claim 1, wherein the third connectors comprise bumps.

9. The device of claim 8, wherein the bumps comprise a nickel-cobalt alloy.

10. A semiconductor device test structure comprising:
- an array of probe pins having a first pitch;
- a substrate with first connectors formed thereon, the first connectors in electrical contact with respective ones of the probe pins;
- redistribution lines located on the substrate facing the probe pins, the redistribution lines in electrical connection with the first connectors;
- vias located through the substrate, the vias in electrical connection with respective ones of the redistribution lines and having a second pitch that is larger than the first pitch;
- a space transformation layer located on the opposite side of the substrate from the probe pins, the spacer transformation layer comprising conductive material electrically connected to the vias through one or more of a first plurality of bumps located between the space transformation layer and the substrate, wherein at least one of a second plurality of bumps located between the space transformation layer and the substrate is not electrically connected to the vias; and
- a printed circuit board located on the opposite side of the space transformation layer than the substrate, the printed circuit board being electrically connected to the conductive material through third connectors, the third connectors having a third pitch larger than the second pitch.

11. The device of claim 10, wherein the vias are located along an outer area of the substrate and the first connectors are located along an inner area of the substrate.

12. The device of claim 10, further comprising dummy connectors located between the substrate and the space transformation layer in an area of the substrate that does not contain vias.

13. The device of claim 10, further comprising a probe head, the probe head comprising:
- a first die with a first array of holes located therein, the first array of holes having a fourth pitch and aligned with the first connectors, the array of probe pins extending through the first array of holes;
- a second die with a second array of holes having a fifth pitch that is substantially similar to the fourth pitch, the second array of holes offset from the first array of holes; and
- a spacer located between the first die and the second die;
- wherein the probe pins extend from the first array of holes to the second array of holes.

14. The device of claim 10, wherein the redistribution lines comprise two or more conductive layers.

15. The device of claim 10, wherein the first pitch is less than about 130 μm.

16. A semiconductor device test structure comprising:
- a substrate with vias located therein, the substrate having a first side and a second side opposite the first side, the vias having a first pitch;
- redistribution lines extending along the surface of the first side of the substrate and in electrical connection with respective ones of the vias; and
- probe pin connector bumps located on the first side of the substrate and in electrical connection with respective ones of the redistribution lines, the probe pin connector bumps having a second pitch that is smaller than the first pitch;
- a space transformation layer comprising conductive material and insulative material, the conductive material electrically connected to the vias through first connectors, the first connectors located on the second side of the substrate; and
- second connectors located between the space transformation layer and the substrate, the second connectors electrically isolated from the first side of the substrate.

17. The device of claim 16, further comprising
a printed circuit board connected to the conductive material in the space transformation layer through third connectors, the third connectors having a third pitch that is larger than the first pitch.

18. The device of claim 16, wherein the second pitch is less than about 130 μm.

19. The device of claim 16, further comprising a probe head, the probe head comprising:
- probe pins in electrical connection with respective ones of the probe pin connector bumps;
- a first die with a first array of holes located therein, the first array of holes having a fourth pitch and aligned with the probe pin connector bumps, the probe pins extending through the first array of holes;
- a second die with a second array of holes having a fifth pitch that is substantially similar to the fourth pitch, the second array of holes being offset from the first array of holes; and
- a spacer located between the first die and the second die;
- wherein the probe pins extend from the first array of holes to the second array of holes.

20. A semiconductor device test structure comprising:
- a substrate with vias located therein, the substrate having a first side and a second side opposite the first side, the vias having a first pitch;
- redistribution lines extending along the surface of the first side of the substrate and in electrical connection with respective ones of the vias;

probe pin connectors located on the first side of the substrate, the probe pin connectors having a second pitch that is smaller than the first pitch;

a space transformation layer comprising conductive material and insulative material, the conductive material electrically connected to the vias through first connectors, the first connectors located on the second side of the substrate, wherein dummy connectors are located between the substrate and the space transformation layer on an inner portion of the substrate where there are no vias; and a printed circuit board connected to the conductive material in the space transformation layer through second connectors, the second connectors having a third pitch that is larger than the first pitch.

* * * * *